US007135866B2

(12) United States Patent
Weiss et al.

(10) Patent No.: US 7,135,866 B2
(45) Date of Patent: Nov. 14, 2006

(54) MULTIFREQUENCY POWER CIRCUIT AND PROBE AND NMR SPECTROMETER COMPRISING SUCH A CIRCUIT

(75) Inventors: Michel Weiss, Gries (FR); Laurent Martinache, Marienthal (FR); Olivier Gonella, Bischwiller (FR)

(73) Assignee: Bruker Biospin SA (Societe Anonyme), Wissembourg (FR)

( * ) Notice: Subject to any disclaimer, the term of this patent is extended or adjusted under 35 U.S.C. 154(b) by 0 days.

(21) Appl. No.: 11/155,664

(22) Filed: Jun. 20, 2005

(65) Prior Publication Data

US 2005/0280417 A1    Dec. 22, 2005

(30) Foreign Application Priority Data

Jun. 18, 2004  (FR) .................................. 04 06661

(51) Int. Cl.
*G01V 3/00* (2006.01)
(52) U.S. Cl. ...................................... 324/322; 324/318
(58) Field of Classification Search ................. 324/322
See application file for complete search history.

(56) References Cited

U.S. PATENT DOCUMENTS

| | | | | |
|---|---|---|---|---|
| 4,446,431 A | * | 5/1984 | McKay ........................ | 324/322 |
| 4,725,780 A | | 2/1988 | Yoda et al. | |
| 5,243,289 A | * | 9/1993 | Blum et al. .................. | 324/322 |
| 5,861,748 A | * | 1/1999 | Schaefer et al. ............. | 324/318 |
| 6,307,371 B1 | * | 10/2001 | Zeiger ......................... | 324/318 |
| 2002/0171426 A1 | * | 11/2002 | Hasegawa .................... | 324/322 |
| 2004/0217761 A1 | * | 11/2004 | Wong et al. ................. | 324/318 |

FOREIGN PATENT DOCUMENTS

EP    1 279 969 A2    1/2003

OTHER PUBLICATIONS

Martin R W et al: "Design of a triple resonance magic sample spinning probe for high field solid state nuclear magnetic resonance" Review of Scientific Instruments, vol. 74, 2003, pp. 3045-3061, XP002320221 ISSN: 0034-6748 * pp. 3049-3054: Paragraphes IV ET V; figs. 3-7*.
Holl S M et al.: "Rotational-echo triple resonance NMR" Journal of Magnetic Resonance, vol. 89, 1990, pp. 620-626, XP000175895 ISSN: 0022-2364 * pp. 625 et 626; fig. 6*.

* cited by examiner

*Primary Examiner*—Diego Gutierrez
*Assistant Examiner*—Megann E. Vaugh
(74) *Attorney, Agent, or Firm*—Young & Thompson

(57) ABSTRACT

A multifrequency power circuit of an NMR coil, includes two power or transmission line segments called principal line segments, each including a segment of a conductor that is attached to the coil, which attached segments together with the coil constitute a first oscillating circuit that exhibits a determined resonance frequency. The principal line segments consist of controlled-impedance multiconductor line segments, each including at least one other conductor segment that is not attached to coil and that extends into the principal line segment beside corresponding respectively attached conductor segment and that exhibits with the latter a capacitive coupling that is distributed along segments located beside or opposite the conductors. These non-attached conductor segments, together with the coil, attached conductor segments and non-attached conductor segments, and optionally with additional power line segments connected to the non-attached conductor segments, form at least one additional oscillating circuit that has a different resonance frequency.

26 Claims, 12 Drawing Sheets

MULTIFREQUENCY POWER CIRCUIT AND PROBE AND NMR SPECTROMETER COMPRISING SUCH A CIRCUIT

BACKGROUND OF THE INVENTION

This invention relates to the field of precision power supplies, in particular in the nuclear magnetic resonance field, and it has as its object a multifrequency power circuit of a coil, in particular a sample coil, as well as an NMR probe and an NMR spectrometer that comprises such a circuit.

DESCRIPTION OF THE RELATED ART

In some applications, it is necessary to use a very specific power, in terms of characteristics and properties of the currents delivered, for circuits that are used in special or extreme circumstances or contexts.

Such is particularly the case for the power of sample or NMR coils, located in the core of the NMR spectrometers.

In particular in the NMR experiments of the solid, it is necessary to use maximum current specifically in the region that receives the sample (subjected to a rotation at several tens of thousands of rotations per second), i.e., in the center of the coil.

Various power systems have already been proposed to address the above-mentioned need.

These known systems, however, do not provide full satisfaction and exhibit limitations.

The multifrequency analysis is actually generalized, and this is why it is necessary to have several ways to power the coil, at different determined frequencies (each corresponding to a type of core to be detected), each meeting the above-mentioned maximum current condition.

The multifrequency power systems currently proposed (see, for example, U.S. Pat. No. 5,861,748) have a very complicated structure (often very difficult to house readily in the narrow cylindrical space that is set aside for that purpose when the probe that contains the coil is received), whereby each power path has to comprise insulation means relative to the influences of the other paths.

Moreover, these known systems are very non-flexible, and even rigid, in terms of frequency variation of different paths or a change in the number of paths (addition of a path or elimination of a path). Any modification in regard to a path affects all other paths existing within the system and requires an adjustment or changes with regard to the latter, which themselves again have additional repercussions, and in particular because of their dissymmetrical structure.

Finally, owing in particular to production complexity and limited available space, the current multifrequency power systems are limited to at most three different power frequencies and to generally less significant powers.

SUMMARY OF THE INVENTION

This invention has as its object to propose a simple solution that allows at least some of the above-mentioned drawbacks to be overcome and to exceed some of the mentioned limitations.

For this purpose, the invention has as its object a multifrequency power circuit of a coil, in particular an NMR coil or a sample coil, comprising two power or transmission line segments called principal line segments, whereby these principal line segments each comprise at least a segment of a conductor attached to one of the ends or terminals of said coil, whereby these attached conductor segments constitute with said coil an oscillating circuit or a first oscillating circuit that exhibits a determined resonance frequency, a circuit that is characterized in that the principal power or transmission line segments consist of controlled-impedance multiconductor line segments, each comprising at least one other conductor segment that is not attached to the coil and that extends into said principal line segment beside the corresponding respectively attached conductor segment and that exhibits with the latter a capacitive coupling that is distributed along segments that are located beside or opposite said conductors, in that said non-attached conductor segments, together with the coil and the attached and non-attached conductor segments, and optionally with additional power line segments that are connected to non-attached conductor segments, form at least one additional oscillating circuit that has a resonance frequency that is different from that of the first oscillating circuit, and in that each of said oscillating circuits is looped to a respectively adjustable tuning circuit or component, and is powered by means of a corresponding respective primary power circuit via a transfer of energy by magnetic coupling, capacitive coupling or magneto-capacitive coupling of said primary power circuit in question with, respectively, at least one of the two attached conductor segments, at least one of the two non-attached conductor segments, or else at least one of the additional line segments that are part of the additional oscillating circuit in question.

BRIEF DESCRIPTION OF THE DRAWINGS

The invention will be better understood thanks to the description below, which relates to preferred embodiments that are given by way of nonlimiting examples and that are explained with reference to attached schematic drawings, in which.

DESCRIPTION OF THE PREFERRED EMBODIMENT

Figure 1:
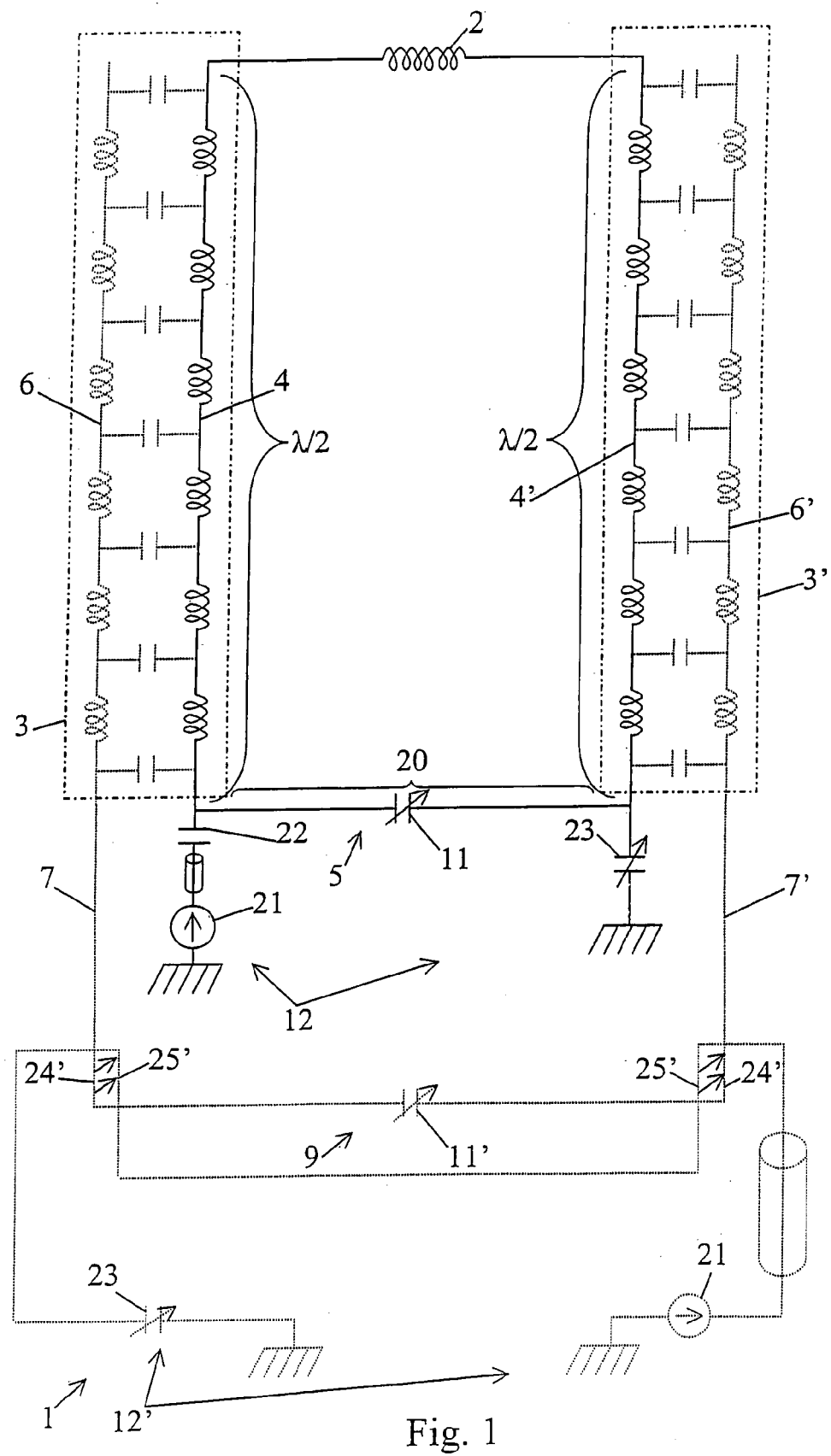
FIG. 1 is a symbolic and functional representation of a first variant of a power circuit with two different frequencies according to the invention.

FIGS. 1 to 5 each show a multifrequency power circuit 1 of a coil 2, in particular of an NMR coil or a sample coil, comprising two power or transmission line segments 3 and 3', so-called principal line segments, whereby these principal line segments 3, 3' each comprise at least one conductor segment 4, 4' that is connected to one of the ends or terminals of said coil 2, and whereby these connected conductor segments 4, 4' constitute with said coil 2 an oscillating circuit or a first oscillating circuit that has a determined resonance frequency.

According to the invention, principal power or transmission line segments 3, 3' consist of controlled-impedance multiconductor line segments that each comprise at least one other conductor segment 6, 6' that is not connected to coil 2 and that extends into said principal line segment 3, 3' beside corresponding respectively attached conductor segment 4, 4' and that exhibits with the latter a capacitive coupling that is distributed along segments that are located beside or opposite said conductors 4, 4' and 6, 6'. In addition, said non-attached conductor segments 6, 6' form, together with coil 2 and attached conductor segments 4', 4' and non-attached conductor segments 6, 6' and optionally with additional power line segments 7, 7'; 8, 8' that are connected to said non-attached conductor segments 6, 6', at least one additional oscillating circuit 9, 10 that has a resonance frequency that is different from that of first oscillating circuit 5. In addition, each of said oscillating circuits 5, 9, 10 is looped to a respective adjustable tuning circuit or component 11, 11', 11" and is powered by means of a corresponding respective primary power circuit 12, 12', 12" via a transfer of energy by magnetic coupling, capacitive coupling or magneto-capacitive coupling of said primary power circuit 12, 12', 12" in question with, respectively, at least one of two attached conductor segments 4, 4', at least one of two non-attached conductor segments 6, 6' or else at least one of additional line segments 7, 7'; 8, 8' that are part of additional oscillating circuit 9, 10 in question.

By the capacitive coupling between attached conductors 4, 4' and non-attached conductors 6, 6' being integrated into additional circuit or circuits 9, 10 that (is) are connected to and comprise non-attached conductor segments 6, 6', the capacitor provides tuning circuit or component 11', 11" of this circuit or each of these circuits 9, 10 can be sized accordingly (requirement for a minimum-value tuning capacitor/reduction of performance levels and thus reduction of space requirement and costs).

According to an important characteristic of the invention, and as is evident in FIGS. 1 to 5, each oscillating circuit 5, 9, 10 has a symmetrical structure and composition integrating attached conductor segments 4, 4' and optionally non-attached conductor segments 6, 6' as well as additional line segments 7, 7'; 8, 8', respectively of identical types and lengths two by two, whereby two attached conductor segments 4, 4' are part of first oscillating circuit 5 that has a length that is a multiple of half of the resonance wavelength of said first oscillating circuit 5.

By the expression "symmetrical structure and composition," applied to the oscillating circuits that are part of power circuit 1, it is necessary to understand at present that each oscillating circuit exhibits electrically, and also physically, a symmetrical structure relative to the center of coil 2. Each oscillating circuit is looped, on the one hand, to this coil 2, and, on the other hand, to an adjustable symmetrical tuning circuit or component 11, 11', 11" that is unique to this circuit, by comprising two identical branches.

Additional oscillating circuit or circuits 9, 10 preferably has (have) one or more resonance frequencies that is (are) higher than that of first oscillating circuit 5, whereby the length of the segments mutually opposite respectively attached conductor segments 4, 4' and non-attached conductor segments 6, 6' of two principal line segments 3, 3' is adequate such that the degree or level of coupling resulting from the line capacitance distributed along said line segments ensures a transfer of energy that is sufficient for the resonance frequency or frequencies of said additional oscillating circuit or circuits 9, 10.

So as to avoid any outside interference or disturbance in regard to principal line segments 3 and 3', the latter advantageously comprise at least one coating or insulation conductor 13 forming a shield around attached and non-attached conductor segments between the latter and the outside.

Figure 12:
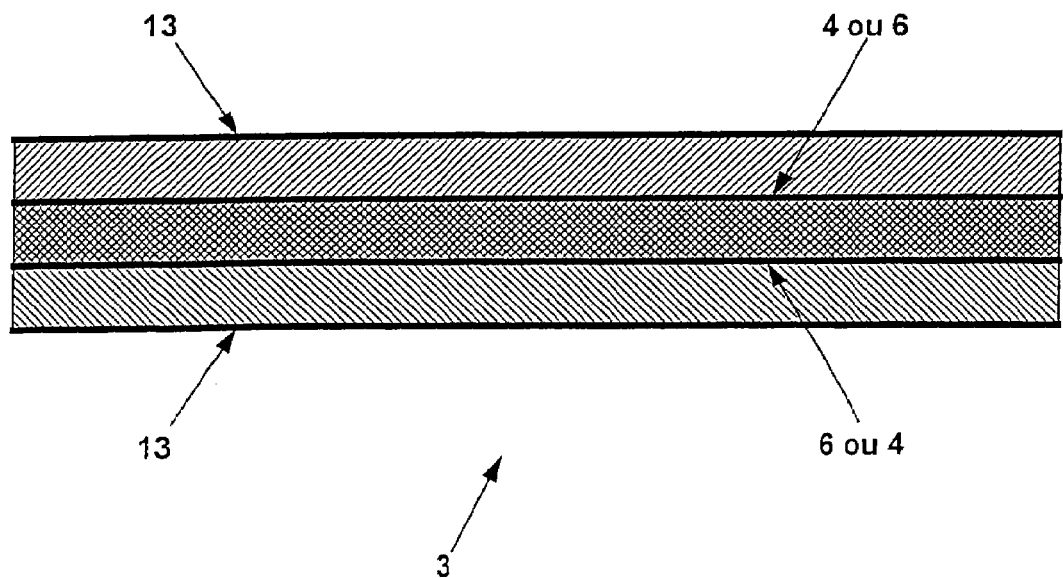
FIG. 12 is a schematic representation, in cross-section, of a principal power or transmission line segment in the form of a stratified or layered line segment (with segments of conductor in bands) that can be part of a multifrequency power circuit according to the invention.

According to a first practical embodiment of transmission or power line segments 3 and 3', shown in FIG. 12 of the attached drawings, conductors 4, 4'; 6, 6' of these line segments 3, 3' can consist of assembled band conductors, with interposed dielectric material, in lines with a stratified structure or in sandwich form, preferably with a flexible composition, whereby additional power line segments 7, 7'; 8, 8' preferably consist of coaxial lines.

These band conductors are separated by dielectric material layers whose nature and thickness determine the degree of capacitive coupling between them.

Figure 11:
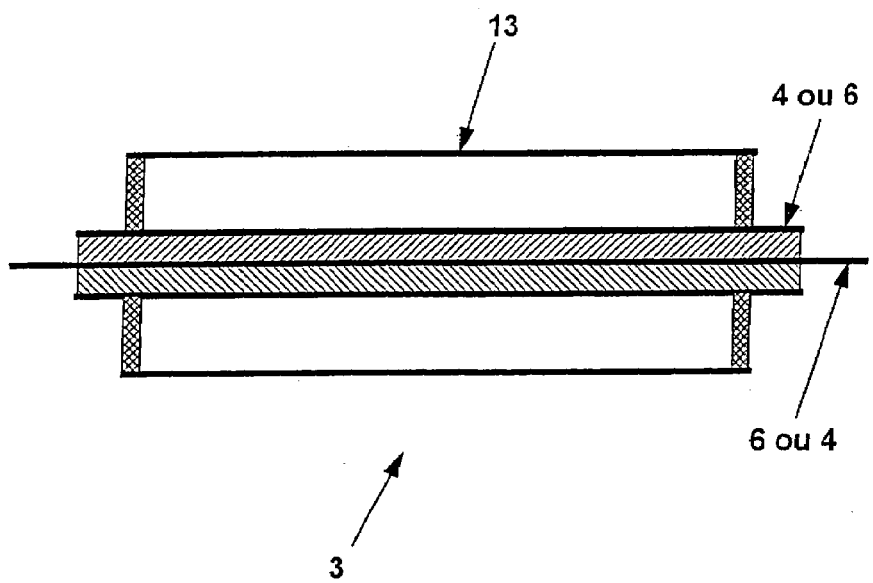
FIG. 11 is a schematic representation, partially in longitudinal section, of a principal power or transmission line segment in the form of a triaxial line segment or with three concentric conductors that can be part of a multifrequency power circuit according to the invention.

According to a second preferred practical embodiment of said principal line segments 3 and 3', shown in FIG. 11 of the attached drawings, conductors 4, 4'; 6, 6' of said principal power or transmission line segments 3, 3' consist of concentric and coaxial conductors, with a central wire conductor and one or more concentric tubular conductors that surround this wire conductor, with insertion of dielectric layers, whereby additional power line segments 7, 7'; 8, 8' preferably consist of coaxial lines.

The concentric conductors are also separated by dielectric layers of different natures and/or thicknesses.

Thus, the layer that separates the central wire conductor from the first concentric tubular conductor can consist of, for example, a polymer (polytetrafluoroethylene), and the layer separating this first tubular conductor from a second concentric tubular conductor can consist of another polymer or air.

Figure 3:
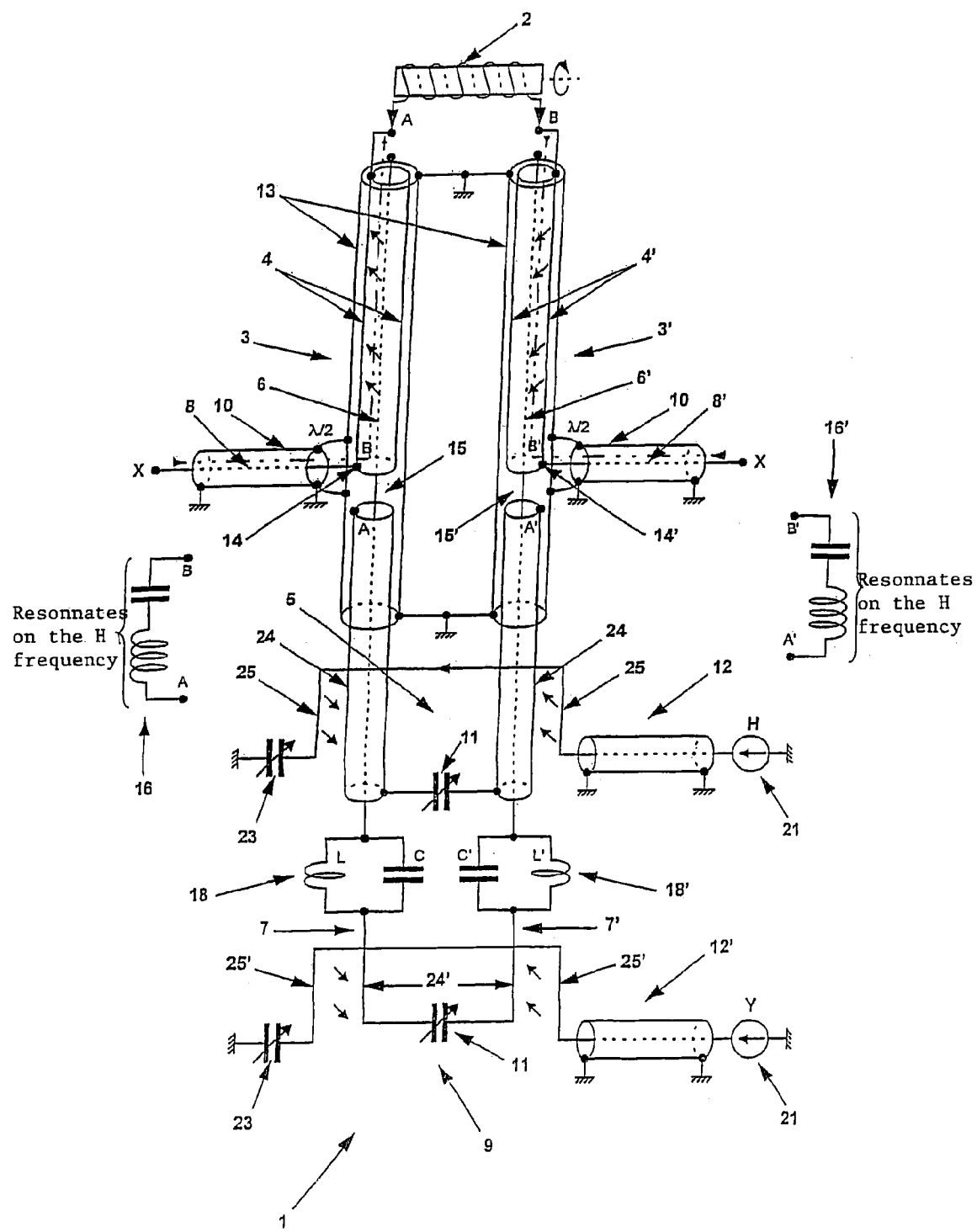
FIGS. 3 to 5 are schematic and partially symbolic representations of three variant embodiments of a power circuit with three different frequencies according to the invention.
Figure 4:
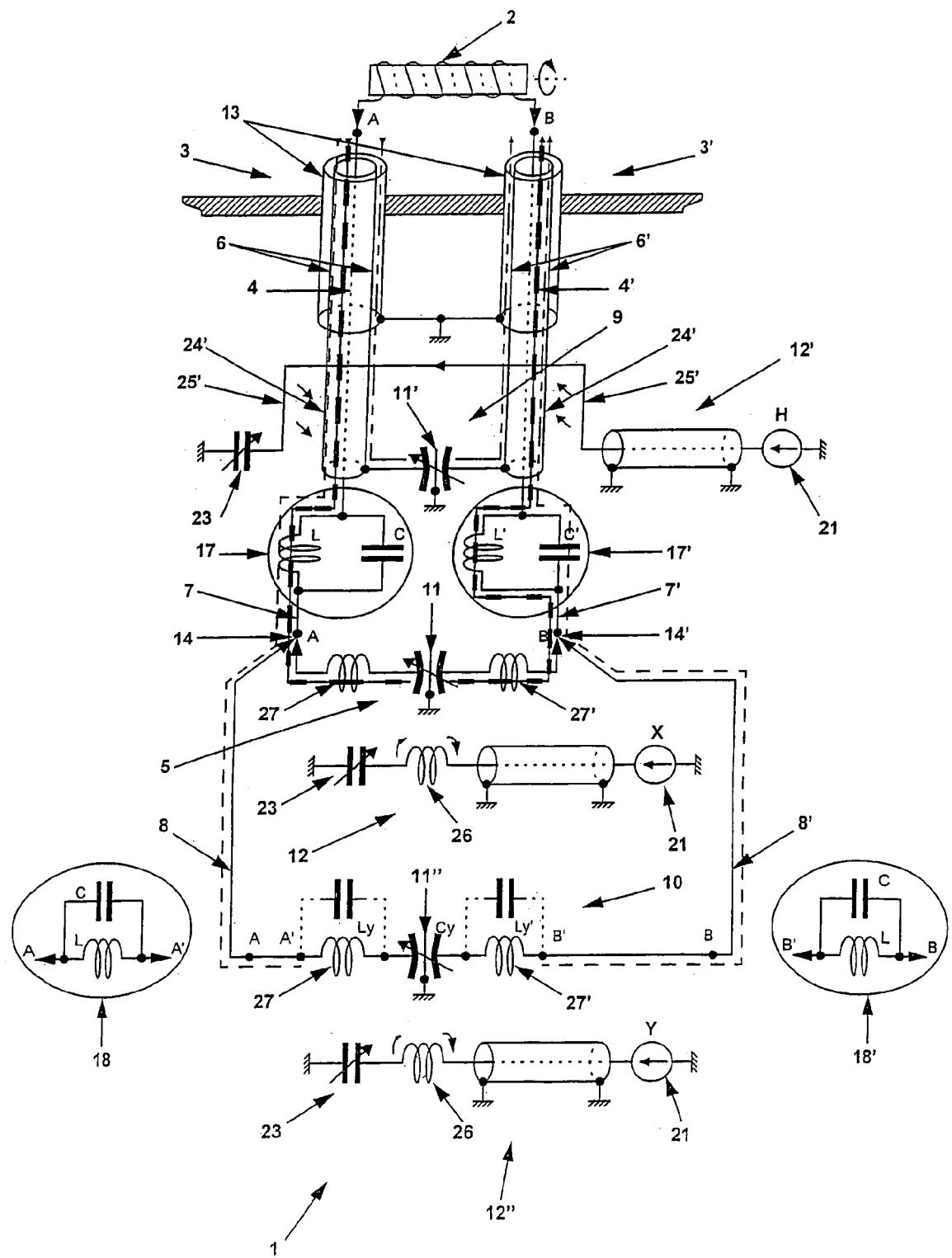
Figure 5:
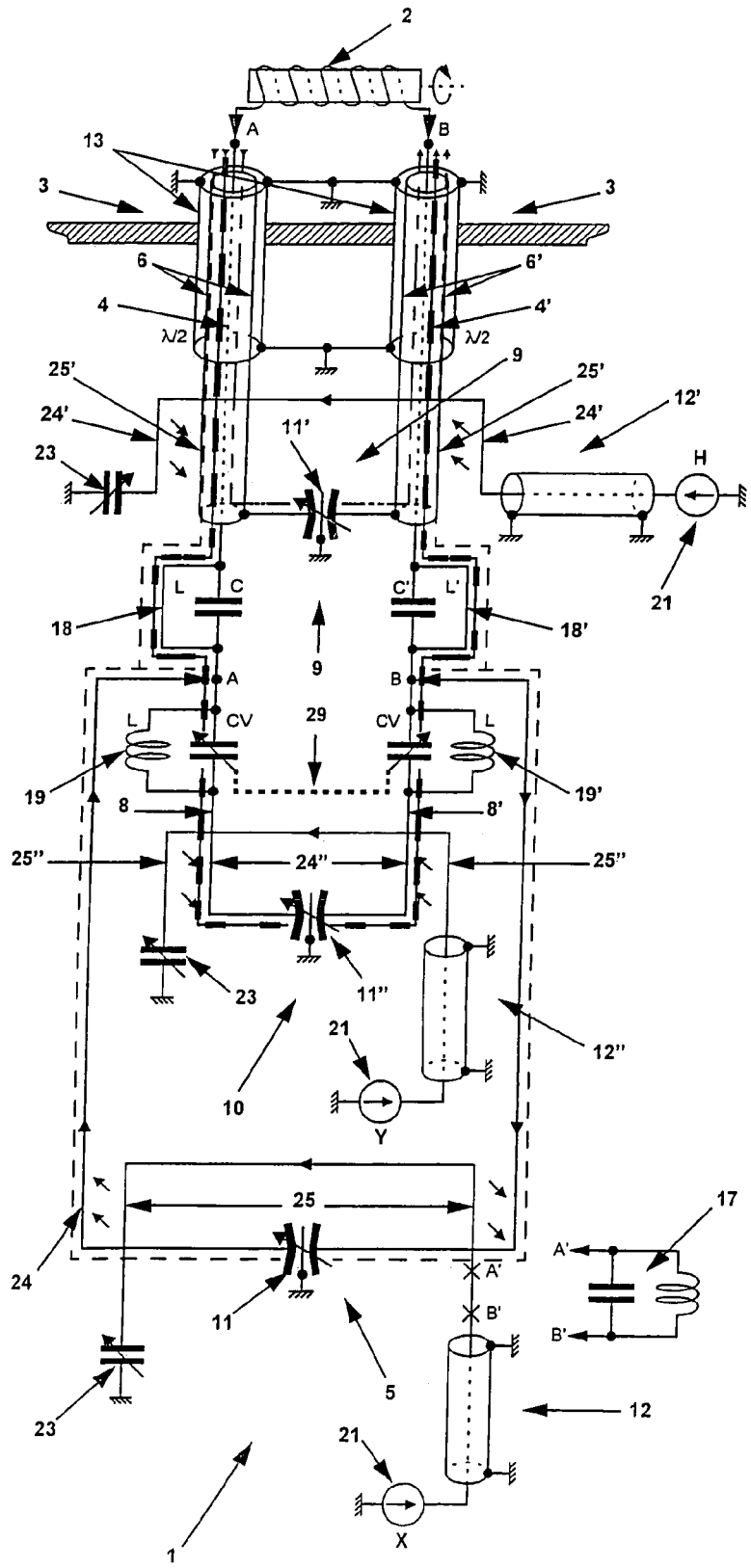

According to a very advantageous first embodiment of the invention, shown in FIGS. 3, 4 and 5 of the attached drawings, power circuit 1 comprises, in addition to first oscillating circuit 5 and an additional first oscillating circuit 9, at least one other additional oscillating circuit 10 with a symmetrical structure and with a resonance frequency that is different from those of above-mentioned oscillating circuits 5 and 9 and constituted by NMR coil 2, by parts of attached conductor segments 4, 4' of principal line segments 3, 3' and by additional transmission line segments 8, 8' that are unique to other oscillating circuit(s) 10. These two sets (separate line segment 8, 8'/consecutive attached conductor segment part 4, 4'] have identical cumulative lengths and are equal to a multiple of a half of the resonance wavelength of this (these) other circuit(s) 10, and these suitable line segments 8, 8' are looped to an adjustable tuning circuit or component 11" with a symmetrical structure at one of their ends and connected by their other ends each to one of attached conductor segments 4, 4' of principal line segments 3, 3' at a non-interfering cold point 14 or 14' of the attached conductor segment (4 or 4') in question.

According to a second very advantageous embodiment of the invention, the power circuit comprises, in addition to first oscillating circuit 5 and an additional first oscillating circuit 9, at least one other additional oscillating circuit 10 with a symmetrical structure and with a resonance frequency that is different from those of above-mentioned oscillating circuits 5 and 9. This or these oscillating circuit(s) 10 is (are) then primarily constituted of transmission line segments 8, 8' that are unique to said other circuit 10, looped to an adjustable tuning circuit or component 11" with a symmetrical structure at one of the ends of each of said suitable line segments 8, 8' and connected by their other end each to one of non-attached conductor segments 6, 6' of principal transmission or power line segments 3, 3'.

It thus is possible to multiply the oscillating circuits that are part of power circuit 1, without having to modify the composition or to adjust the parameters of the oscillating circuits that are already part of this power circuit, while altering neither the power paths provided by the latter nor the symmetrical structure and behavior of the unit (ensuring maximum current at the center of coil 2).

The invention thus provides a possibility of producing a multipath power circuit of a multistage type that does not alter the existing circuit structure when an additional oscillating circuit (i.e., a power path) is added, in particular facing principal line segments 3 and 3' (whereby the latter and coil 2 are part of each of oscillating circuits 5, 9, 10).

In general, the spectrometric analyses require the provision of three different excitation frequencies for the detection of three types of cores. These three frequency channels generally comprise a high frequency that corresponds to the resonance of the H core (proton—named channel H) and two other channels that cover the resonant cores in a lower frequency band. This lower frequency band is divided into two sub-bands, whereby sub-band Y corresponds to a low sub-band, and sub-band X corresponds to the high sub-band (respectively named channel Y and channel X).

In the figures of the attached drawings, some additional indications (in addition to numerical references) make it possible to identify the circuit components or parts that belong to or take part in power paths of these three channels.

Advantageously, and relative to a simple practical embodiment, multiconductor line segments 3, 3' that constitute the principal power or transmission line segments each comprise, in addition to a coating or shield conductor 13, a first conductor segment 4, 4' that is attached to coil 2 and a second conductor segment 6, 6' that is not attached to coil 2 and is coupled in a capacitive manner to said first conductor segment 4, 4'.

Preferably and as is schematically evident from FIGS. 2 to 5 and as shown more specifically in FIG. 11 by way of embodiment, multiconductor line segments 3 and 3' can consist of triaxial line segments or with three concentric conductors 4, 6, 13; 4', 6', 13', whereby at least first oscillating circuit 5 integrates conductor segments 4, 4' that are connected directly to coil 2 of said triaxial lines 3, 3' and said at least one additional oscillating circuit 9 integrates additional non-attached concentric conductor segments 6, 6' of said triaxial lines 3, 3', whereby a transfer of energy is carried out between these respectively associated concentric conductors because of the distributed line capacitance of said triaxial lines 3, 3'.

As FIG. 11 shows, each line segment 3, 3' can consist of, for example, a coaxial cable that is mounted either in a metal tube or in place of the central conductor of a coaxial cable of the largest diameter.

According to a first variant, conductor segments 4, 4' that are connected directly to coil 2 of triaxial lines 3, 3' consist of intermediate conductors of the latter and said at least one additional oscillating circuit 9 comprises central conductor segments 6, 6' that are not attached to coil 2, whereby the line capacitance that is distributed between the central and intermediate conductors provides a connection by coupling that allows said at least one additional oscillating circuit 9 that is being considered to loop to coil 2 via said intermediate conductors 4, 4' that are attached to the latter (FIG. 3).

In this latter case, it can be provided that intermediate conductor segments 4, 4' each exhibit a cutoff or physical discontinuity 15, 15' at a respective non-interfering cold point and that additional line segments 8, 8' of said at least one other additional oscillating circuit 10 are connected at said cold points to said intermediate conductor segments 4, 4' that are connected to coil 2, whereby the two parts of said intermediate conductor segments 4, 4' that face each other at said cutoff or discontinuity 15, 15' are connected together by frequency-selective energy transfer circuits 16, 16', for example pass-band filters that are centered on the resonance frequency of first oscillating circuit 5 and transmitting maximum energy for this frequency.

According to a second variant, conductor segments 4, 4' that are directly connected to coil 2 of triaxial lines consist of the central conductor segments of the latter and said at least one additional oscillating circuit 9 integrates intermediate conductor segments 6, 6' that are not connected to coil 2, whereby the line capacitance that is distributed between these central and intermediate conductors provides a connection by coupling that allows said at least one additional oscillating circuit 9 that is being considered to loop to coil 2 via central conductors 4, 4' that are connected to the latter (FIGS. 4 and 5).

In this latter case, it can be provided that the conductors of additional line segments 8, 8' of said at least one other additional oscillating circuit 10 are connected to central conductors 4, 4' at non-interfering cold points 14, 14' of these conductors, and that reject filters 17, 17' insulate between them first oscillating circuit 5 and other additional oscillating circuit(s) 10 whose additional line segments 8, 8' are connected to said central conductors. These latter oscillating circuits 5, 10 are also insulated from said at least one additional oscillating circuit 9 that integrates intermediate conductors that are not connected to the coil, by suitable reject filters 18, 18"; 19, 19'.

The different oscillating circuits 5, 9, 10 can be powered either directly (by galvanic connection) or indirectly (by coupling).

Thus, according to a first possible embodiment, shown in FIG. 1, primary power circuit 12, 12', 12" of at least one of oscillating circuits 5, 9, 10 is partially merged with this oscillating circuit by integrating a part of common circuit 20 with this oscillating circuit, and said primary power circuit 12, 12', 12" comprises, on the one hand, a radio-frequency generator 21 that is tuned to the determined resonance frequency of associated oscillating circuit 5, 9, 10 and attached to said oscillating circuit at a terminal of the corresponding adjustable symmetrical tuning circuit or component 11, 11', 11" via a coupling capacitor 22, and, on the other hand, an adaptation circuit or component 23 that is attached to the other terminal of said adjustable symmetrical tuning circuit or component, whereby adaptation component 23 and adjustable symmetrical tuning component 11, 11', 11" are part of two circuits 12, 12', 12" and 5, 9, 10, consisting of capacitors and generator 21 that can operate continuously, intermittently, or in surges.

According to a second possible embodiment that is evident from FIGS. 2 to 6, primary power circuit 12, 12', 12" of at least one of oscillating circuits 5, 9, 10 consists of a separate circuit and comprises, in addition to a radio-frequency generator 21 that is tuned to the determined resonance frequency of the oscillating circuit in question and part or parts that take part in coupling with at least one of two conductor segments 4, 4' attached to coil 2 of one or more principal line segments 3, 3' and to tuning circuit or component 11, 11', 11", also an adaptation circuit or component 23 that is intended to optimize the coupling and to limit some of its effects in regard to said primary power circuit.

Relative to this second possibility, the coupling or each coupling [primary power circuit 12, 12', 12"/corresponding oscillating circuit 5, 9, 10 in question] is a coupling that is essentially magnetic in nature, and adaptation circuit or component 23 is an adjustable capacitor intended to cancel the inductive reactance at the primary power circuit that is being considered.

Advantageously and to preserve the symmetry of the unit, the transfer of energy by coupling between a primary power circuit 2, 12', 12" and associated oscillating circuit 5, 9, 10 consists of a double coupling and symmetrically and equivalently assigns similar conductor segments (4, 4'; 6, 6') of two transmission line segments 3, 3'; 8, 8'; 7, 7' in question.

Figure 2:
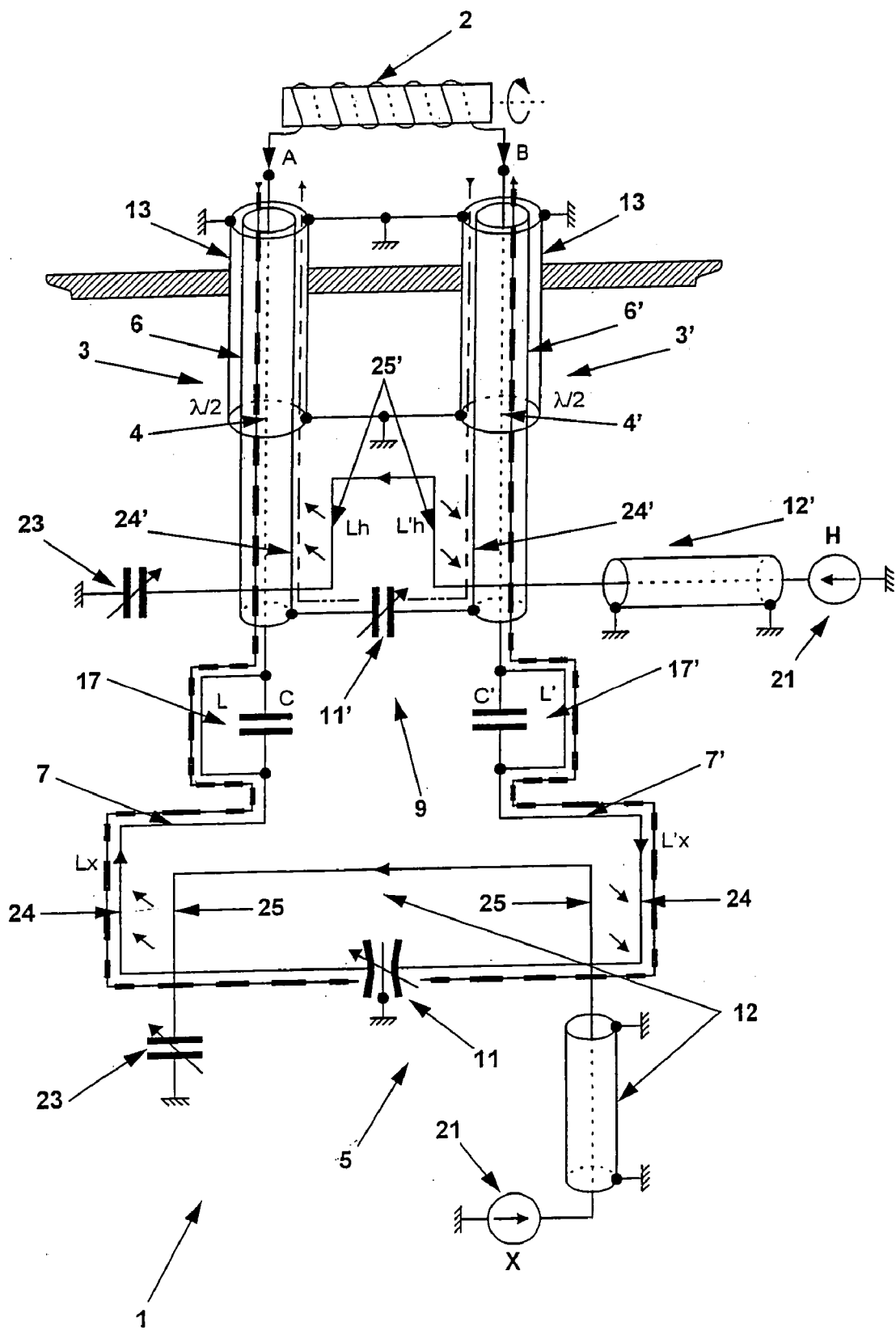
FIG. 2 is a schematic representation, partially symbolic, of a second variant embodiment of a power circuit with two different frequencies according to the invention.

As shown in FIGS. 2, 3 and 5 and according to a first practical embodiment variant of coupling 5, 9, 10/12, 12', 12", the coupling or each of two couplings [primary power circuit 12, 12', 12"/corresponding oscillating circuit 5, 9, 10 in question] that carries out the transfer of energy between these two circuits can consist of a primarily magnetic coupling between, on the one hand, a segment 24, 24', 24" of a conductor segment of one of line segments 3, 3'; 7, 7'; 8, 8' of oscillating circuit 5, 9, 10 that is being considered, and, on the other hand, a segment 25, 25', 25" opposite of the line that connects generator 21 to adaptation component 23 in associated primary power circuit 12, 12', 12", whereby the two segments of each of these pairs of segments that are associated with one another 24, 25; 24', 25'; 24", 25" have determined lengths and are placed in parallel and close to one another so as to form Lecher lines.

Figure 6:
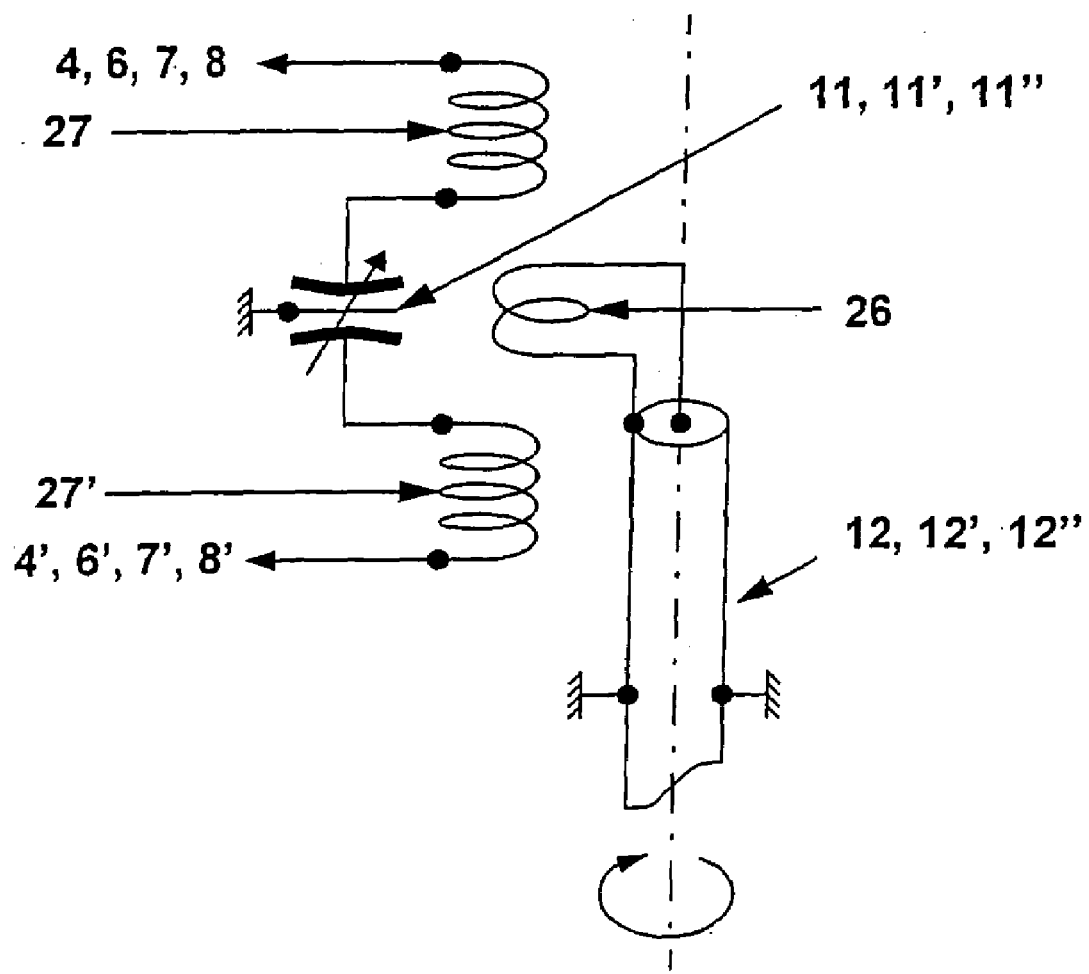
FIG. 6 is a schematic representation of an embodiment of a variable magnetic coupling between an oscillating circuit and a corresponding primary power circuit that is part of a power circuit according to the invention.

As shown in FIGS. 4 to 6 and according to a second practical variant embodiment of coupling 5, 9, 10/12, 12', 12", the coupling or each coupling with energy transfer [primary power circuit 12, 12', 12"/corresponding oscillating circuit 5, 9, 10 in question] can consist of a symmetrical or asymmetrical magneto-capacitive coupling between, on the one hand, a solenoid 26 that is mounted in series in said primary power circuit 12, 12', 12", and, on the other hand, a capacitor/inductance unit that is mounted in series in associated oscillating circuit 5, 9, 10 in question, whereby said capacitor can correspond to tuning component 11, 11', 11", and inductances 27 and 27' can comprise two equivalent inductances that are mounted in series on both sides of said tuning capacitor, optionally by each being part of an LC circuit.

For the purpose of insulating the paths that are likely to be disturbed by one or more other paths, it is advantageously provided that first oscillating circuit 5 and/or said at least one additional oscillating circuit 9, 10 integrate one or more band-reject insulation filters 17, 17'; 18, 18'; 19, 19', if necessary each of them, tuned to the resonance frequency of one or the other of the other oscillating circuit(s).

The insulation filters preferably come in the form of (a) pair(s) of filters being placed symmetrically in the oscillating circuit in question, whereby each filter of a given pair of filters is connected in series to or mounted in series with one of the conductor segments that are part of said oscillating circuit in question.

Figure 7:
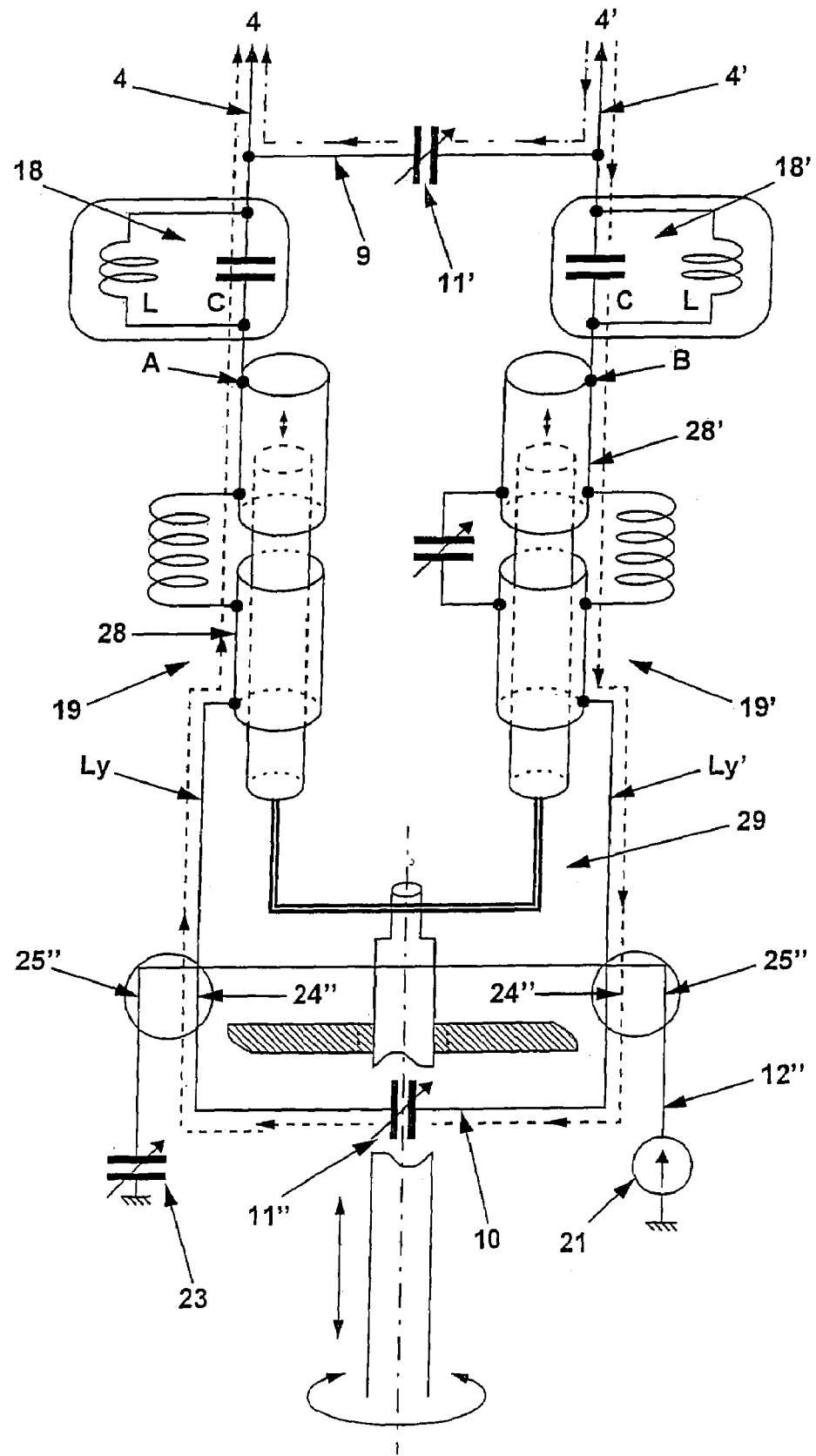
FIG. 7 is a schematic representation of an embodiment of the reject filter units that are part of the multifrequency power circuit shown in FIG. 5.

As FIGS. 5 and 7 of the attached drawings show, and in the presence of a first oscillating circuit 5 and two additional oscillating circuits 9 and 10, at least one 10 of said oscillating circuits integrates two insulation filter pairs 17, 17'; 18, 18'; 19, 19', whereby each pair of filters is tuned to the resonance frequency of one of two other oscillating circuits 5 and 9, one 19, 19' of the pair of filters being at least adjustable in frequency, preferably continuously.

In this latter case, these filters can consist of pairs of LC circuits, pair or pairs of filters 19, 19' optionally adjustable in frequency and integrating variable capacitors 28, 28' continuously with a mutual mechanical control for tuning them 29.

Variable capacitors 28 can consist of, for example, a moving part that is integral with one of the terminals of the capacitor and a stationary part that is integral with the other terminal, whereby the moving parts of two capacitors 28 are physically and/or kinematically connected to one another so as to be simultaneously displaced from the same amplitude of movement. The relative displacement of moving parts relative to the stationary parts varies the value of the capacitance of said variable capacitors 28.

Figure 8A:
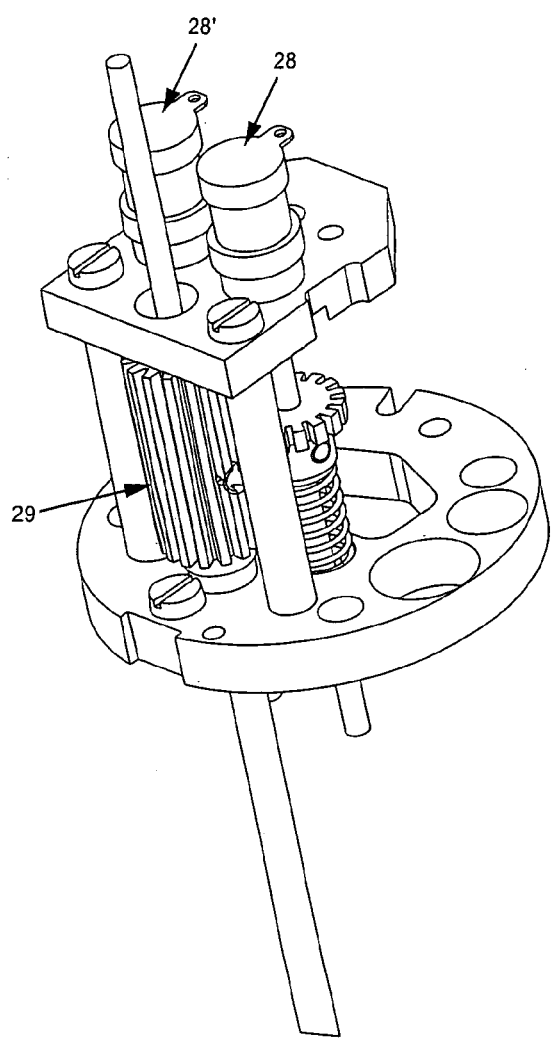
FIGS. 8A and 8B are perspective views of another embodiment of the variable capacitors of a pair of reject filters that are part of the power circuit shown in FIG. 5.
Figure 8B:
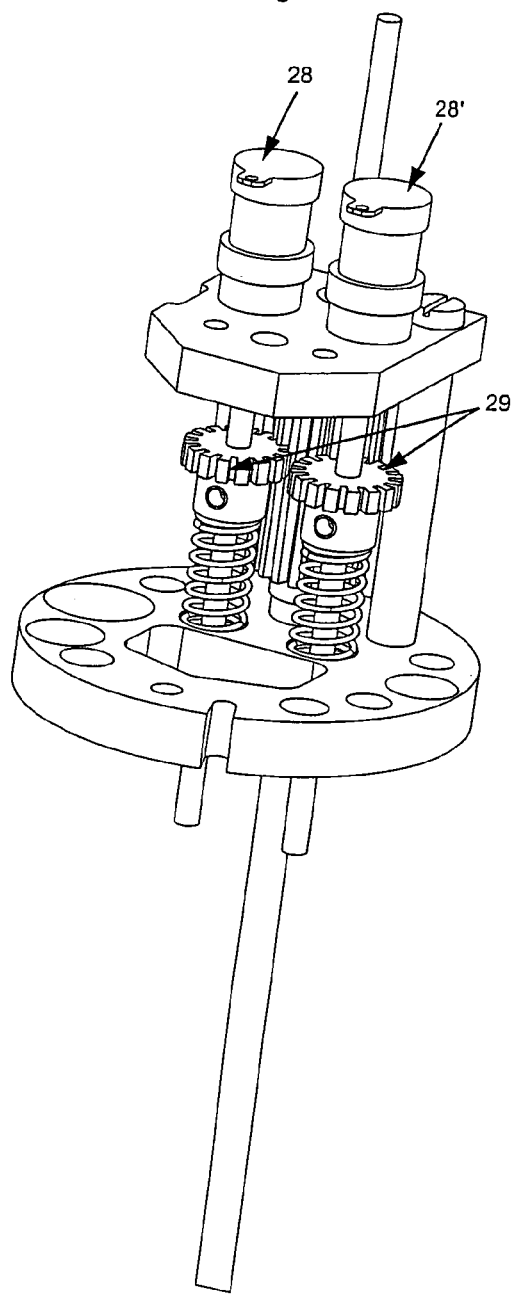
Figure 9:
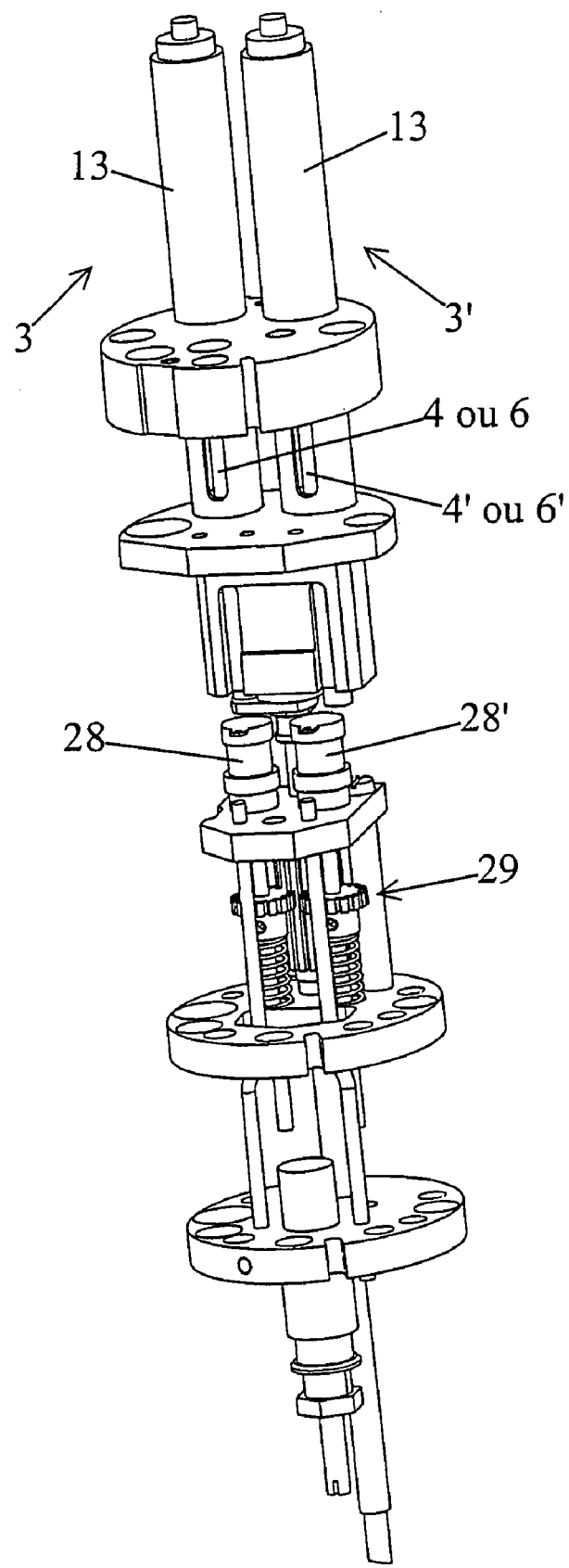
FIG. 9 is a perspective view of the pair of capacitors of FIGS. 8A and 8B, integrated into a portion of a multifrequency NMR probe according to the invention.

Said movement can consist of a translational motion (FIG. 7), whereby the moving part thus forms a mobile plunger that extends into the hollow cylinder that is formed by the stationary part, and the two plungers are connected mechanically by a rigid connecting bar that is integral with a moving part (millimeter screw, for example). The movement can also consist of a rotation (FIGS. 8A, 8B and 9), the two moving parts then being mounted on rotating shafts equipped with gear wheels that are driven jointly by a drive gear that is integral with a control rod.

Thanks to the invention, it is therefore possible to provide power with maximum intensity that is always located exactly in the center of coil 2, regardless of the excitation frequency in question.

Also, the addition of an additional oscillating circuit (with a symmetrical structure), associated with a corresponding resonance frequency, has essentially no influence on the oscillating circuits that are already part of the power circuit, and in particular does not bring about any dissymmetry in these existing circuits.

Furthermore, transmission line segments 3 and 3' that are used by all oscillating circuits 5, 9, 10 (and at least partly in common with the latter) are not modified and are not the object of any tuning operation, even during the addition of a new oscillating circuit.

Figure 10A:
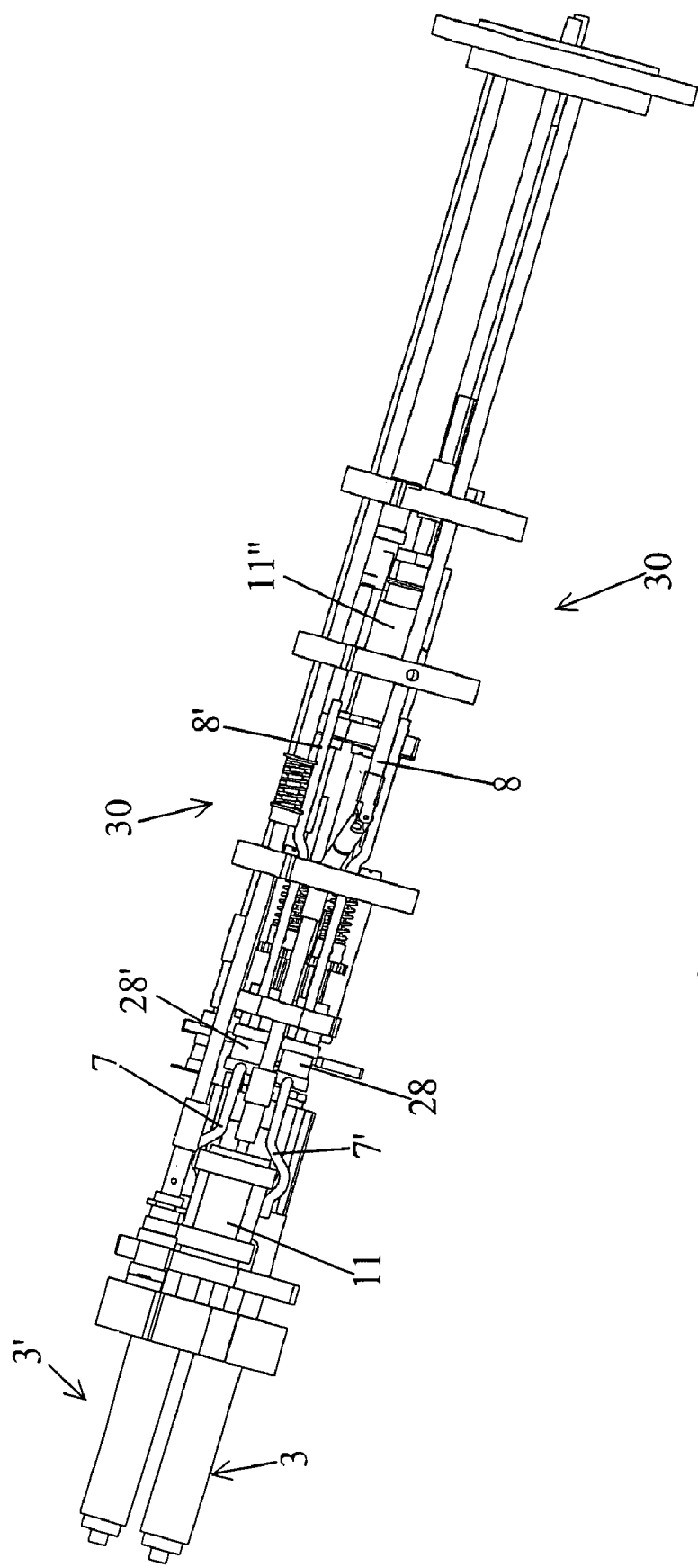
FIGS. 10A, 10B and 10C are views respectively in lateral elevation (FIGS. 10A and 10B) and in perspective (FIG. 10C), on different scales, of a multifrequency NMR probe, provided with a power circuit according to an embodiment of the invention.
Figure 10B:
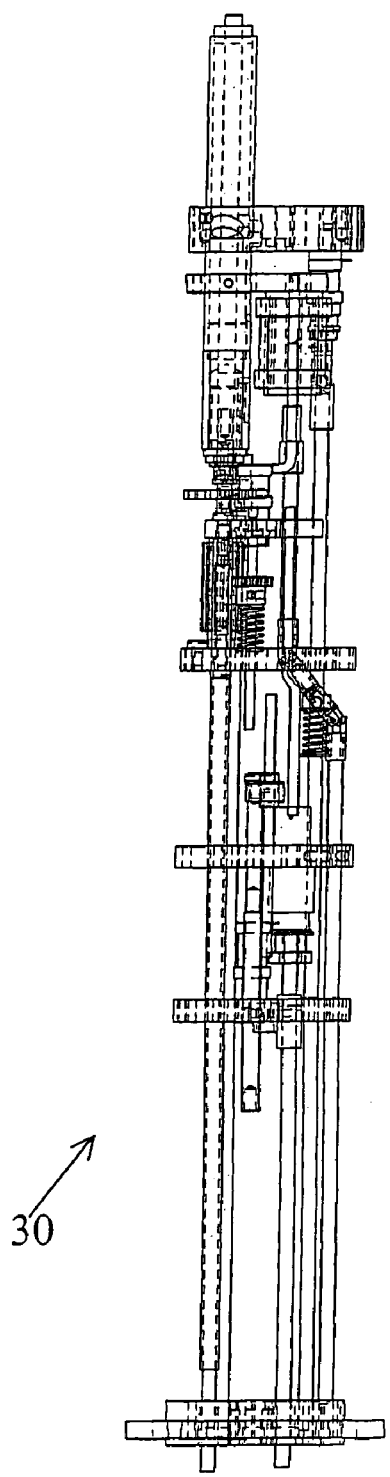
Figure 10C:
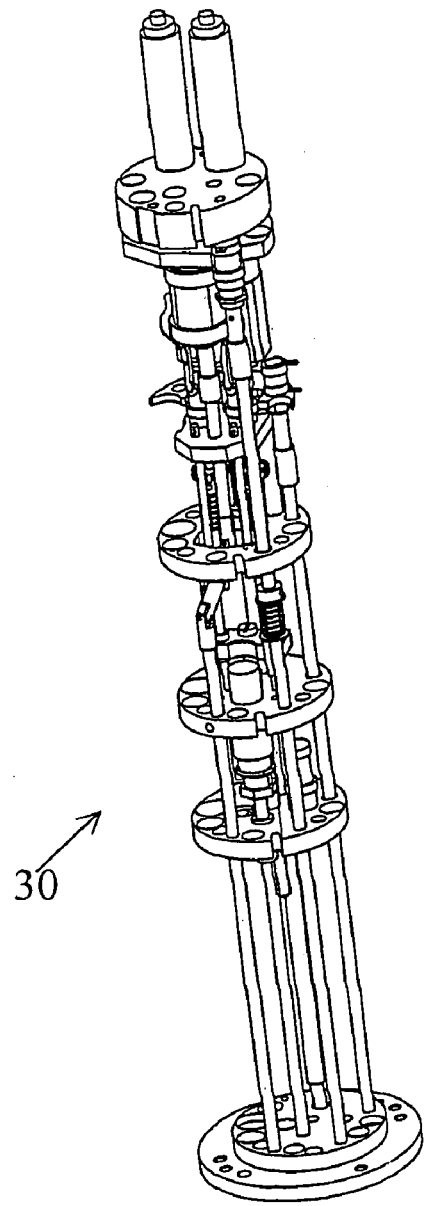

The invention also has as its object a multifrequency NMR 30 probe, characterized in that it comprises, at least in part, a power circuit 1 of sample coil 2 that exhibits at least some of the characteristics indicated above (FIGS. 10A, 10B and 10C).

Finally, the invention also covers an NMR spectrometer, in particular for solid-phase spectrometry, characterized in that it comprises a power circuit 1 of sample coil 2 as described above and a probe of the type mentioned above.

Of course, the invention is not limited to the embodiment described and shown in the attached drawings. Modifications are possible, in particular from the standpoint of the composition of various elements or by substitution of equivalent techniques, without thereby going outside the field of protection of the invention.

The invention claimed is:

1. Multifrequency power circuit of a coil, comprising:
a coil (2) with two ends,
two principal power or transmission line segments (3, 3'),
each principal line segment (3, 3') comprising at least an attached conductor segment (4, 4') attached to one of the ends of said coil,
the attached conductor segments (4, 4') constituting, with said coil, a first oscillating circuit (5) that exhibits a determined first resonance frequency, wherein,
said principal line segments (3, 3') further comprise controlled-impedance multiconductor line segments,
each multiconductor line segment comprises a non-attached conductor segment (6, 6') that is not attached to said coil (2) and that extends into said principal line segment (4, 4') and that exhibits with the corresponding attached conductor segment (4, 4'), a capacitive coupling that is distributed along conductor segments that are located beside said attached and non-attached conductor segment (4, 4' and 6, 6'),
said non-attached conductor segments (6, 6'), together with the coil (2) and the attached conductor segments (4, 4') and with additional power line segments (7, 7'; 8, 8') that are connected to said non-attached conductor segments (6, 6'), form a second oscillating circuit (9) that has a second resonance frequency that is different from the first resonance frequency of the first oscillating circuit (5), and
each of said first and second oscillating circuits (5, 9) is looped to a respectively adjustable tuning circuit (11, 11'), and is powered by a corresponding respective primary power circuit (12, 12') via a transfer of energy by one of
magnetic coupling with at least one of two attached conductor segments (4, 4'),
capacitive coupling with at least one of two non-attached conductor segments (6, 6'), and
magneto-capacitive coupling of said primary power circuit (12, 12') with at least one of the additional line segments (7, 7'; 8, 8') that are part of the second oscillating circuit (9).

2. Power circuit according to claim 1, wherein each oscillating circuit (5, 9) has a symmetrical structure and composition integrating the attached conductor segments (4, 4') of identical types and lengths two by two, whereby two attached conductor segments (4, 4') are part of first oscillating circuit (5) that has a length that is a multiple of half of the resonance wavelength of said first oscillating circuit (5).

3. Power circuit according to claim 1, wherein the second oscillating circuit has a resonance frequency higher than the resonance frequency of the first oscillating circuit (5), whereby the length of the segments mutually opposite respectively attached conductor segments (4, 4') and non-attached conductor segments (6, 6') of the two principal line segments (3, 3') provides a degree or level of coupling resulting from the line capacitance distributed along said line segments that ensures a transfer of energy sufficient for the resonance frequency of said second oscillating circuit (9, 10).

4. Power circuit according to claim 1, wherein the two principal line segments (3 and 3') comprise at least a coating or insulation conductor (13) forming a shield around the attached and the non-attached conductor segments between the attached and nonattached conductor segments and the outside.

5. Power circuit according to claim 1, wherein conductors (4, 4'; 6, 6') of the principal line segments (3, 3') comprise assembled band conductors, with interposed dielectric material, in lines with one of a stratified structure and a sandwich form, and the additional power line segments (7, 7'; 8, 8') consist of coaxial lines.

6. Power circuit according to claim 1, wherein attached and non-attached conductors segments (4, 4'; 6, 6') of the principal line segments (3, 3') comprise one of concentric and coaxial conductors, with a central wire conductor and one or more concentric tubular conductors that surround the central wire conductor, with interposed dielectric layers, and whereby the additional power line segments (7, 7'; 8, 8') comprise coaxial lines.

7. Power circuit according to claim 1,
further comprising a third oscillating circuit (10) with a symmetrical structure and with a third resonance frequency that is different from the first and second resonance frequencies, and constituted by an NMR coil (2), by parts of the attached conductor segments (4, 4') of the principal line segments (3, 3') and by additional line segments (8, 8') that are unique to said third oscillating circuit (10),
wherein the unique additional line segments (8, 8') are looped to an adjustable tuning circuit (11") with a symmetrical structure at one of their ends and connected by their other ends each to one of the attached conductor segments (4, 4') of the principal line segments (3, 3') at a non-interfering cold point (14 or 14').

8. Power circuit according to claim 1, further comprising at least one third oscillating circuit (10) with a symmetrical structure and with a resonance frequency that is different from the first and second resonance frequencies, and wherein the third oscillating circuit (10) is primarily constituted by additional line segments (8, 8') that are unique to said other third oscillating circuit (10), looped to an adjustable tuning circuit or component (11") with a symmetrical structure at one of the ends of each of said unique additional line segments (8, 8') and each connected by their other end to one of the nonattached conductor segments (6, 6').

9. Power circuit according to claim 1, wherein the principal line segments each comprise a coating or shield conductor (13), with each attached conductor segment (4, 4') capacitively coupled to a corresponding non-attached conductor segment (6, 6').

10. Power circuit according to claim 1, wherein,
the principal line segments (3, 3') comprise one of i) triaxial lines and ii) three concentric conductors (4, 6, 13; 4', 6', 13'), whereby
at least the first oscillating circuit (5) integrates the attached conductor segments (4, 4'), and
said second oscillating circuit (9) integrates the nonattached concentric conductor segments (6, 6') of said triaxial lines (3, 3'),
whereby a transfer of energy is carried out due to distributed line capacitance of said triaxial lines (3, 3').

11. Power circuit according to claim 10,
wherein the attaced conductor segments (4, 4') consist of intermediate conductors of the triaxial lines, and
wherein said second oscillating circuit (9) comprises the non-attached conductor segments (6, 6'), whereby the line capacitance that is distributed between the non-attached conductor segments and intermediate conductors providing a connection by coupling that allows said second oscillating circuit (9).

12. Power circuit according to claim 11,
wherein the intermediate conductor of the attached conductor segments (4, 4') each exhibit a cutoff or physical discontinuity (15, 15') at a respective noninterfering cold point and wherein the additional line segments (8, 8') of said third additional oscillating circuit (10) are connected at said cold points,
whereby two parts of said intermediate conductor segments (4, 4') facing each other at said cutoff or discontinuity (15, 15') are connected together by frequency-selective energy transfer circuits (16, 16').

13. Power circuit according to claim 10,
wherein said second oscillating circuit (9) integrates the nonattached conductor segments (6, 6'),
whereby the line capacitance that is distributed provides a connection by coupling that allows said second oscillating circuit (9) to loop to the coil (2) via the attached conductor segments (4, 4').

14. Power circuit according to claim 13,
wherein the conductors of the additional line segments(8, 8') of a third oscillating circuit (10) are connected to the attached conductors segments (4, 4') at non-interfering cold points (14, 14'),
wherein reject filters (17, 17') insulate the first oscillating circuit (5) and the third oscillating circuit (10), and
wherein the first and the third oscillating circuits (5, 10) are also insulated from said second oscillating circuit (9) by reject filters (18, 18'; 19, 19').

15. Power circuit according to claim 14, wherein the reject filters comprise pairs of LC circuits, pairs of filters, and integrating variable capacitors (28, 28') with a mutual mechanical control for tuning them (29).

16. Power circuit according to claim 1,
wherein said primary power circuit (12, 12') merges with at least one of the oscillating circuits (5, 9) by integrating a part of a common circuit (20), and
wherein said primary power circuit (12, 12') comprises, a radio-frequency generator (21) tuned to the determined resonance frequency of associated oscillating circuit (5, 9) and attached to said one oscillating circuit at a terminal of corresponding adjustable symmetrical tuning circuit or component (11, 11') via a coupling capacitor (22), and an adaptation circuit or component (23) that is connected to the other terminal of said adjustable symmetrical tuning circuit or component,
whereby the adaptation component (23) and the adjustable symmetrical tuning component (11, 11') are part of two circuits (12, 12', and 5, 9), comprised of capacitors and the generator (21) that can operate continuously, intermittently, or in surges.

17. Power circuit according to claim 1, wherein the primary power circuit (12, 12') of at least one of the oscillating circuits (5, 9) is comprised of
a separate circuit,
a radio-frequency generator (21) that is tuned to the determined resonance frequency of the one oscillating circuit,
a part coupling with at least one of the two attached conductor segments (4, 4') connected to the coil (2) and to the tuning circuit or component (11, 11'), and
an adaptation circuit or component (23) to optimize the coupling and to limit coupling effects in regard to said primary power circuit.

18. Power circuit according to claim 17,
wherein the coupling is a coupling that is essentially magnetic in nature, and
wherein the adaptation circuit (23) is an adjustable capacitor to cancel the inductive reactance at the primary power circuit.

19. Power circuit according to claim 18,
wherein the coupling comprises a primarily magnetic coupling between a first segment (24, 24') of an associated oscillating circuit (5, 9) and a second segment (25, 25') opposite of the line that connects the generator (21) to the adaptation component (23) in the associated primary power circuit (12, 12'), and
whereby the two first and second segments are placed in parallel and close to one another so as to form Lecher lines.

20. Power circuit according to claim 18, wherein,
the coupling comprises a symmetrical or asymmetrical magneto-capacitive coupling between a solenoid (26) that is mounted in series in said primary power circuit (12, 12'), and a capacitor/inductance unit that is mounted in series in the associated oscillating circuit (5, 9),
said capacitor is a tuning capacitor corresponding to the tuning component (11, 11'), and inductances (27 and 27') of the inductance unit comprise two equivalent inductances that are mounted in series on both sides of said tuning capacitor.

21. Power circuit according to claim 17, wherein the transfer of energy by coupling between the primary power circuit (12, 12') and the associated oscillating circuit (5, 9) comprises a double coupling and symmetrically and equivalently assigns corresponding attached and non-attached conductor segments (4, 4'; 6, 6') of principal and additional power line segments (3, 3'; 7, 7'; 8, 8').

22. Power circuit according to claim 1, wherein at least one of the first oscillating circuit (5) and the second oscillating circuit (9, 10) integrate one or more band-reject insulation filters (17, 17'; 18, 18'; 19, 19') tuned to the resonance frequency of the other oscillating circuit(s).

23. Insulation circuit according to claim 22,
wherein the insulation filters are each a pair of filters that are placed symmetrically in the associated oscillating circuit,
whereby each filter of a given pair of filters is connected in series with one of the conductor segments that are part of said associated oscillating circuit.

24. Power circuit according to claim 22,
wherein there are three oscillating circuits (5, 9, 10),
at least one of said three oscillating circuits (10) integrates two of the insulation filter pairs (17, 17'; 18, 18'; 19, 19'), and
whereby each insulation filter pair is tuned to the resonance frequency of one of two other oscillating circuits (5 and 9), one of the insulation filter pairs (19, 19') being adjustable in frequency.

25. Multifrequency power circuit of a coil, comprising:
a coil (2) with two ends;
two principal power line segments (3, 3'),
each principal line segment (3, 3') comprising
i) an attached conductor segment (4, 4') attached to one of the two ends of said coil, and
ii) a controlled-impedance multiconductor line segment, the multiconductor line segment comprising a non-attached conductor segment (6, 6') that is not attached to said coil (2) and extending into said principal line segment (3, 3') beside a corresponding attached conductor segment (4, 4') and exhibiting, with the corresponding attached conductor segment (4, 4'), a capacitive coupling that is distributed along other conductor segments that are located beside said attached and nonattached conductor segments (4, 4' and 6, 6')

a first oscillating circuit comprised of one of the attached conductor segments (4, 4') and said coil, the first oscillating circuit having a determined first resonance frequency; and a second oscillating circuit (9, 10) comprised of one of the nonattached conductor segments (6, 6'), said coil (2), a corresponding one of the attached conductor segments (4, 4'), and additional power line segments (7, 7'; 8, 8') that are connected to said nonattached conductor segment (6, 6'), the second oscillating circuit (9, 10) having a second resonance frequency that is different from the first resonance frequency, wherein, each of said first and second oscillating circuits (5, 9, 10) is looped to a respectively adjustable tuning circuit (11, 11', 11"), and is powered by a corresponding respective primary power circuit (12, 12', 12") via a transfer of energy by one of i) magnetic coupling with at least one attached conductor segment (4, 4'), ii) capacitive coupling with at least one non-attached conductor segment (6, 6'), and iii) magneto-capacitive coupling of said primary power circuit (12, 12', 12") with at least one additional line segment (7, 7'; 8, 8') that is part of the second oscillating circuit (9, 10).

26. Multifrequency power circuit of a coil, comprising:

a coil (2) with two ends;

two principal power line segments (3, 3'), each principal line segment (3, 3') comprising i) an attached conductor segment (4, 4') attached to one of the two ends of said coil, and ii) a controlled-impedance multiconductor line segment, the multiconductor line segment comprising a nonattached conductor segment (6, 6') that is not attached to said coil (2) and extending into said principal line segment (3, 3') beside a corresponding attached conductor segment (4, 4') and exhibiting, with the corresponding attached conductor segment (4, 4'), a capacitive coupling;

a first oscillating circuit comprised of one of the attached conductor segments (4, 4') and said coil, the first oscillating circuit having a determined first resonance frequency; and a second oscillating circuit (9, 10) comprised of one of the nonattached conductor segments (6, 6'), said coil (2), and a corresponding one of the attached conductor segments (4, 4'), the second oscillating circuit (9, 10) having a second resonance frequency that is different from the first resonance frequency, wherein, each of said first and second oscillating circuits (5, 9, 10) is looped to a respectively adjustable tuning circuit (11, 11', 11"), and is powered by a corresponding respective primary power circuit (12, 12', 12") via a transfer of energy by one of i) magnetic coupling with at least one attached conductor segment (4, 4'), and ii) capacitive coupling with at least one non-attached conductor segment (6, 6').

* * * * *